(12) United States Patent
Krippendorf et al.

(10) Patent No.: US 11,056,309 B2
(45) Date of Patent: Jul. 6, 2021

(54) METHOD AND DEVICE FOR IMPLANTING IONS IN WAFERS

(71) Applicant: mi2-factory GmbH, Jena (DE)

(72) Inventors: Florian Krippendorf, Jena (DE); Constantin Csato, Stammbach (DE)

(73) Assignee: MI2-FACTORY GMBH, Jena (DE)

( * ) Notice: Subject to any disclaimer, the term of this patent is extended or adjusted under 35 U.S.C. 154(b) by 0 days.

(21) Appl. No.: 16/348,800

(22) PCT Filed: Nov. 27, 2017

(86) PCT No.: PCT/EP2017/080526
§ 371 (c)(1),
(2) Date: May 9, 2019

(87) PCT Pub. No.: WO2018/096145
PCT Pub. Date: May 31, 2018

(65) Prior Publication Data
US 2019/0267209 A1 Aug. 29, 2019

(30) Foreign Application Priority Data
Nov. 25, 2016 (DE) .................. 10 2016 122 791.9

(51) Int. Cl.
*H01J 37/05* (2006.01)
*C23C 14/18* (2006.01)
(Continued)

(52) U.S. Cl.
CPC .............. *H01J 37/05* (2013.01); *C23C 14/18* (2013.01); *C23C 14/48* (2013.01);
(Continued)

(58) Field of Classification Search
CPC .... H01J 37/05; H01J 37/1472; H01J 37/1477; H01J 37/3171; H01J 37/20;
(Continued)

(56) References Cited

U.S. PATENT DOCUMENTS

| 4,421,988 A | 12/1983 | Robertson | |
| 2011/0297842 A1* | 12/2011 | Ninomiya | H01J 37/304 250/396 ML |

(Continued)

FOREIGN PATENT DOCUMENTS

| DE | 102005061663 A1 | 7/2007 |
| DE | 102011075350 A1 | 11/2012 |

(Continued)

OTHER PUBLICATIONS

ICSCRM2015: "Alternative highly homogeneous drift layer doping for 650 V SiC devices."—R. Rupp, W. Schustereder, Tobias Höchbauer, Ronny Kern, Michael Rüb, Constantin Csato, Florian Krippendorf, 2016.

(Continued)

*Primary Examiner* — Kiet T Nguyen
(74) *Attorney, Agent, or Firm* — Lucas & Mercanti, LLP

(57) ABSTRACT

A method comprising the irradiation of a wafer by an ion beam that passes through an implantation filter, the ion beam being electrostatically deviated in a first direction and a second direction in order to move the ion beam over the wafer, and the implantation filter being moved in the second direction to match the movement of the ion beam.

9 Claims, 7 Drawing Sheets

(51) Int. Cl.
*C23C 14/48* (2006.01)
*H01J 37/147* (2006.01)
*H01J 37/20* (2006.01)
*H01J 37/317* (2006.01)
*H01L 21/04* (2006.01)
*H01L 29/32* (2006.01)
*H01L 21/265* (2006.01)

(52) U.S. Cl.
CPC ...... *H01J 37/1472* (2013.01); *H01J 37/1477* (2013.01); *H01J 37/20* (2013.01); *H01J 37/3171* (2013.01); *H01L 21/046* (2013.01); *H01L 21/0415* (2013.01); *H01L 29/32* (2013.01); *H01J 2237/024* (2013.01); *H01J 2237/0456* (2013.01); *H01J 2237/0458* (2013.01); *H01J 2237/0475* (2013.01); *H01J 2237/057* (2013.01); *H01J 2237/1518* (2013.01); *H01J 2237/20214* (2013.01); *H01J 2237/31701* (2013.01); *H01J 2237/31705* (2013.01); *H01J 2237/31711* (2013.01); *H01J 2237/31713* (2013.01); *H01L 21/265* (2013.01)

(58) Field of Classification Search
CPC ......... H01J 2237/057; H01J 2237/0458; H01J 2237/31713; H01J 2237/31701; H01J 2237/31705; H01J 2237/024; H01J 2237/20214; H01J 2237/0456; H01J 2237/0475; H01J 2237/1518; H01J 2237/31711; C23C 14/18; C23C 14/48; H01L 29/32; H01L 21/046; H01L 21/265; H01L 21/0415
USPC .................................................. 250/492.21
See application file for complete search history.

(56) References Cited

U.S. PATENT DOCUMENTS

| | | | | |
|---|---|---|---|---|
| 2015/0311077 | A1* | 10/2015 | Kurose | H01J 37/3171 438/5 |
| 2016/0233295 | A1* | 8/2016 | Schulze | H01L 21/26546 |
| 2019/0049850 | A1 | 2/2019 | Rupp | |

FOREIGN PATENT DOCUMENTS

| | | |
|---|---|---|
| DE | 102015114429 A1 | 3/2017 |
| EP | 0014516 A1 | 10/1980 |
| JP | H08250062 A | 9/1996 |

OTHER PUBLICATIONS

"Energy filter for tailoring depth profiles in semiconductor doping application."—C. Csato et al., Nuclear Instruments and Methods in Physics Research Section B: Beam Interactions with Materials and Atoms 365 (2015), S. 182-186.

Krippendorf et al: "Dotierung von SiC mittels Energiefilter fuer Ioneimplantation", Jan. 1, 2015 (Jan. 1, 2015), MIKROSYSTEMTECHNIK 2015; 4 (Conference Info: MIKROSYSTEMTECHNIK 2015—MIKROSYSTEMTECHNIK KONG RESS 2015; 2015; Karlsruhe, Deutschland), pp. 334-337, XP009194563.

"Investigation of dopant profiles, losses and heating using an energy filter for ion implantation."—Krippendorf, Csato, Rüb. DPG Spring Conference. Dresden, Mar. 2014.

"Energy filter for ion implantation."—F. Krippendorf, C. Csato, T. Bischof, S. Gupta, W. Han, M. Nobst, University of Applied Sciences Jena; C. Ronning, Friedrich Schiller University Jena; R. Rupp, Infineon Technologies AG, Neubiberg; A. Schewior, University of Applied Sciences Jena; W. Wesch, Friedrich Schiller University Jena: W. Morgenroth, Institute for Photonic Technologies, Jena; M. Rüb, University of Applied Sciences Jena. Microsystem Engineering Congress, Aachen, Oct. 2014.

Csato, T. Bischof, S. Gupta, W. Han, F. Krippendorf, W. Morgenroth, M. Nobst, C. Ronning, R. Rupp, A. Schewior, W. Wesch, M. Rüb: Jun. 12, 2013, Workshop "Ion Beams—Research and Application", 2013, Leibniz Institute for Surface Modification Leipzig.

M. Rüb: "Energy filters for high-energy ion implantation", IP.com; Disclosure No. IPCOM000018006D. Original publication date: Dec. 1, 2001. Added to the Prior Art Database on Jul. 23, 2003; Siemens, AG, 2001, Siemens Technical Report, Dec. 2001, 9 pages.

"The Gap between Research and Commercial Product in Applied Physics Research—An Issue for Sustainability and an Opportunity?"—Prof. Dr. Michael Rueb, University of Applied Sciences Jena, 6th ICEBE (International Conference on Engineering and Business Education), Windhoek, Namibia, Oct. 7-10, 2013.

M. Rueb, T. Bischof, C. Csato, S. Gupta, W. Han, F. Krippendorf, A. Schewior, C. Möse, "Energy filters for ion implantation systems", research report of the University of Applied Sciences Jena, 2011/2012.

* cited by examiner

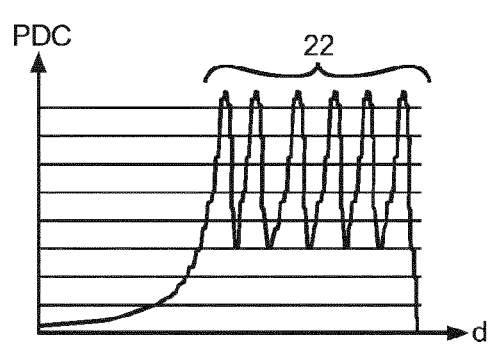
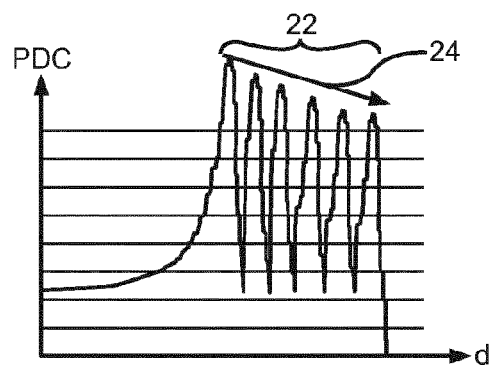
Fig.3a    Fig.3b
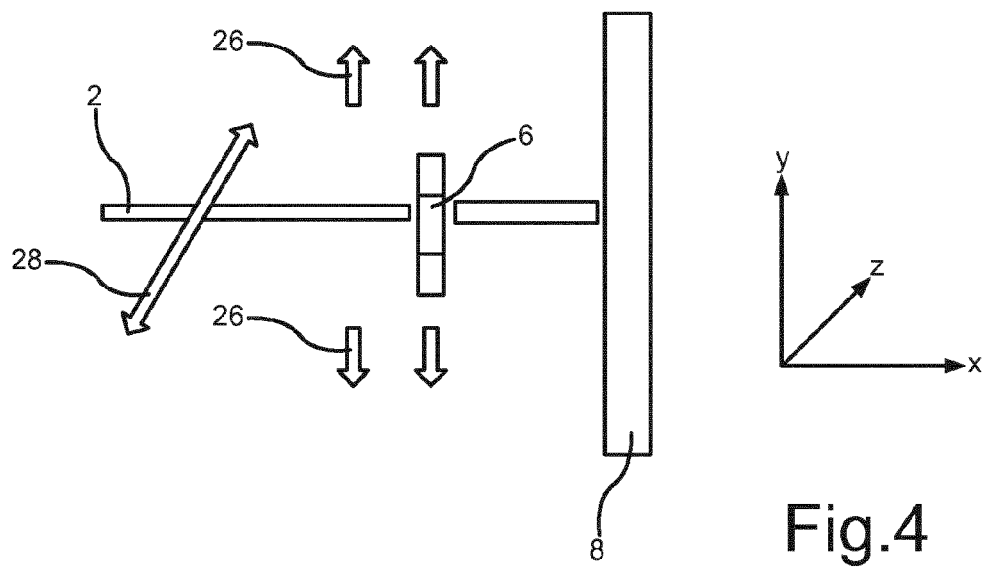
Fig.4

US 11,056,309 B2

METHOD AND DEVICE FOR IMPLANTING IONS IN WAFERS

CROSS-REFERENCE TO RELATED APPLICATIONS

The present application is a 371 of International application PCT/EP2017/080526, filed Nov. 27, 2017, which claims priority of DE 10 2016 122 791.9, filed Nov. 25, 2016, the priority of these applications is hereby claimed and these applications are incorporated herein by reference.

FIELD OF THE INVENTION

The invention relates to a method and a device for implanting ions in wafers.

In more concrete terms, the invention deals with the apparatus-related aspects involved in the doping of semiconductors and with the production of defect profiles for modifying the life of the charge carriers in semiconductor components by the use of an energy filter for ion implantation.

The following references on this topic can be cited by way of example:

[1] ICSCRM2015: "Alternative highly homogeneous drift layer doping for 650 V SiC devices."—R. Rupp, W. Schustereder, Tobias Höchbauer, Ronny Kern, Michael Rüb, Constantin Csato, Florian Krippendorf.

[2] "Energy filter for tailoring depth profiles in semiconductor doping application."—C. Csato et al., Nuclear Instruments and Methods in Physics Research Section B: Beam Interactions with Materials and Atoms 365 (2015), S. 182-186

[3] "Analysis of lateral energy distribution for passive ion beam scattering element."-Weiqi Han, Constantin Csato, Florian Krippendorf, Michael Rib, Carsten Ronning. DPG Spring Conference, Dresden, March 2014.

[4] "Investigation of dopant profiles, losses and heating using an energy filter for ion implantation."—Krippendorf, Csato, Rib. DPG Spring Conference, Dresden, March 2014.

"The Gap between Research and Commercial Product in Applied Physics Research—An Issue for Sustainability and an Opportunity?"—Prof. Dr. Michael Rueb, University of Applied Sciences Jena, 6$^{th}$ ICEBE (International Conference on Engineering and Business Education), Windhoek, Namibia, Oct. 7-10, 2013.

[5] "Energy filter for ion implantation."—F. Krippendorf, C. Csato, T. Bischof, S. Gupta, W. Han, M. Nobst, University of Applied Sciences Jena; C. Ronning, Friedrich Schiller University Jena; R. Rupp, Infineon Technologies AG, Neubiberg; A. Schewior, University of Applied Sciences Jena; W. Wesch, Friedrich Schiller University Jena; W. Morgenroth, Institute for Photonic Technologies, Jena; M. Ruib, University of Applied Sciences Jena. Microsystem Engineering Congress, Aachen, October 2014, "Energy filter for ion implantation systems, Idea—Preliminary Experiments—Application, C."

[6] Csato, T. Bischof S. Gupta, W. Han, F. Krippendorf, W. Morgenroth, M. Nobst, C. Ronning, R. Rupp, A. Schewior, W. Wesch, M. Rib: Jun. 12, 2013, Workshop "Ion Beams—Research and Application", 2013, Leibniz Institute for Surface Modification Leipzig. M. Rüb, T. Bischof, C. Csato, S. Gupta, W. Han, F. Krippendorf, A. Schewior, C. Möse, "Energy filters for ion implantation systems", research report of the University of Applied Sciences Jena, 2011/2012.

[7] EP 0 014 516 A1.

[8] M. Rüb: "Energy filters for high-energy ion implantation", IP.com; Disclosure No. IPCOM000018006D. Original publication date: Dec. 1, 2001. Added to the Prior Art Database on Jul. 23, 2003; Siemens AG, 2001, Siemens Technical Report, December 2001, 9 pages.

[9] DE 10 2011 075350 A1.

[10] DE 10 2015 114 429 A1 describes an implantation unit in which the filter holder is shiftable relative to the wafer holder.

In the field of microtechnological, commercially oriented production, ion implantation is used for doping and for producing defect profiles at predefined depths ranging from a few nanometers up to several 100 micrometers in any desired material such as semiconductors (silicon, silicon carbide, gallium nitride) or optical materials (LiNbO$_3$).

A so-called energy filter 6 is well-adapted to ion implantation. An energy filter 6 of this type is described in, for example, EP 0 014 516 A1 and is shown in FIG. 1. FIG. 2 shows a possible installation of an energy filter 6 in a system for ion implantation for the purpose of wafer processing. Reference number 2 designates the ion beam, reference number 3 a first ion, reference number 4 a second ion, reference number 8 a substrate, reference number 10 a square distribution (with filter), and reference number 12 a Gaussian distribution (without filter).

The energy filter 6 is structured in such a way that it has areas of different thicknesses. The thickest area is, for example, more than 1.5 times, more than 2 times, more than 3 times, or more than 5 times as thick as the thinnest area. The structure can be triangular, for example, as shown in FIG. 1. This is only an example, however. Any other types of structures are also possible.

The basic principle of the energy filter 6 is as follows: As a monoenergetic ion beam 2 passes through the microstructured energy filter component, its energy is modified depending on the point where it enters. The resulting energy distribution of the ions leads to a modification of the depth profile of the implanted substance in the matrix of the substrate 8.

FIGS. 2a and 2b show the arrangement of wafers on a rotating wafer wheel 20 in combination with a static, i.e., primarily Gaussian, ion beam 2. Reference number 13 designates the implantation chamber, reference number 14 the beam line insert 14, reference number 15 the beam opening, and reference number 16 the suspension of the filter membrane 18.

In the example of FIGS. 2a and 2b, the energy filter suspension 16 and the wafer wheel 20 are arranged in a vacuum-engineering unit, the so-called "end station". FIG. 2a shows a wafer wheel 20, on which the substrates 8 to be implanted are mounted. During processing/implantation, the wafer wheel 20 is tilted by 900 and set in rotation. The ion beam 2, indicated by the broken line, therefore "writes" concentric circles on the wafer wheel 20. To irradiate the entire surface of the wafer, the wafer wheel 20 is moved vertically during processing, i.e., the wafer wheel 20 oscillates in the vertical direction. FIG. 2b shows the mounted energy filter 6 in the area of the beam outlet.

Finally, it has been shown that an increase in the substrate temperature, especially in association with the use of SiC, leads to a reduction of the point defect concentration. This has been observed in particular during high-dose implantations of Al in SiC. On this point, see V. Heera et al., *Applied Surface Science*, 184 (2001), 307-316; C. A. Fisher et al.: 11$^{th}$ European Conference on Silicon Carbide and Related Materials, September 2016, Halkidki, Greece, Book of Abstracts; N. S. Saks et al.: *Applied Physics Letters* 84, 5195 (2004); doi 10.1063/1.1764934. The only foreign-atom profiles known "as implanted" are Gaussian (more accurately, Pearson-distributed). Under high-temperature implantation conditions, such profiles comprise a reduced (Gaussian) concentration (also peak concentrations) of point defects in comparison to low-temperature implantations. In addition, doping profiles produced by means of high-temperature implantation can, in the course of subsequent healing processes, show a higher degree of activation and a better reproducibility of the degree of activation.

The present invention offers solutions to the following problems:

It would be desirable to eliminate the rotational and oscillating movements of the wafer wheel 20 because of the considerable mechanical complexity involved.

If the energy filter 6 is positioned in an opening of the implantation chamber 13 (which can also be called the irradiation chamber or the wafer chamber), as shown in FIGS. 2a and 2b, it is possible, during the production or release of a vacuum (pumping down/venting) in the irradiation chamber, for mechanical stresses on the filter membrane 18 to occur as a result of the suction exerted by the vacuum pumps or as a result of the inflowing air. Particles originating from the particle-contaminated ambient air, furthermore, can become deposited in the microstructures of the microstructured filter membrane 18 and impair the functionality of the energy filter 6. Such mechanical stresses and particle depositions should be avoided.

It is desirable for the fewest possible point defects to be produced in the semiconductor material during the implantation. Known defect profiles for a chain implantation with several discrete implantation energies are shown in FIGS. 3a and 3b; compare also DE 102 39 312 B4. In FIGS. 3a and 3b, PDC stands for "point defect concentration", and d stands for "depth". Reference number 22 stands for the waviness of the defect profile, and reference number 24 stands for the decrease attributable to summation effects. A distinction is made between two cases. Case 1 (FIG. 3a) is that in which the deeper-lying implantations do not result in a summation of the point defects. Such effects of self-healing by ion implantation are known; see Wendler et al.: *Nuclear Instruments and Methods in Physics Research B*, 141 (1998) 105-117; and Rambach et al.: *Nucl. Instr. and Meth. in Phys. Res. B*, 237 (2005) 68-71. Case 2 (FIG. 3b) is the case in which the point defect concentration is subject to a summation effect.

To solve the problems cited above, the following secondary conditions in particular should be considered:

(A) The distance between the energy filter 6 and the substrate 8 (wafer) during the implantation should be in a range between a few millimeters and a few centimeters.

(B) The energy filter 6 should have the largest possible lateral dimensions so that the energy input from the ion beam 2 can be distributed over the largest possible area. As a result, the heating of the energy filter 6 is decreased, and the current-carrying capacity is increased.

(C) The mounting of the energy filter 6 should be as adaptable as possible, because, according to the current state of development, it must be expected that different energy filter design concepts will be required for different applications.

(D) The filter membrane 18 should not be exposed to any mechanical vibrations if at all possible, for example those which can occur during the venting and pumping-down processes when the irradiated substrates 8 are to be replaced.

(E) To the extent possible, the microstructured filter membrane 18 should not be exposed to the particle-contaminated outside air, because the functionality of the energy filter 6 could be impaired by particle deposits.

(F) The device for arranging the energy filter 6 and the wafer chuck 45 or wafer wheel 20 should be designed so that it is possible to produce implantation profiles by the use of the energy filter 6 in such a way that the generation of point defects is reduced, especially in the case of the semiconductor material SiC.

SUMMARY OF THE INVENTION

Solutions according to the invention are defined in the independent claims and are described in greater detail below with reference to the drawings. What are described in particular are possible embodiments of an ion implantation system or of parts of such an ion implantation system and methods for operating an ion implantation system and its parts. These systems and methods are adapted to the implantation of ions in wafers of any desired semiconductor material, especially, however, in wafers based on silicon carbide (SiC).

BRIEF DESCRIPTION OF THE DRAWINGS

FIGS. 3a and 3b show known point defect concentration profiles in SiC for discrete chain implantations;

FIG. 4 is a cross-sectional view of an ion implantation setup with a fixed substrate, a scanned ion beam, and an implemented energy filter with synchronized oscillating movement between the ion beam and the energy filter in the y direction;

DETAILED DESCRIPTION OF SPECIFIC EMBODIMENTS

Figure 1:
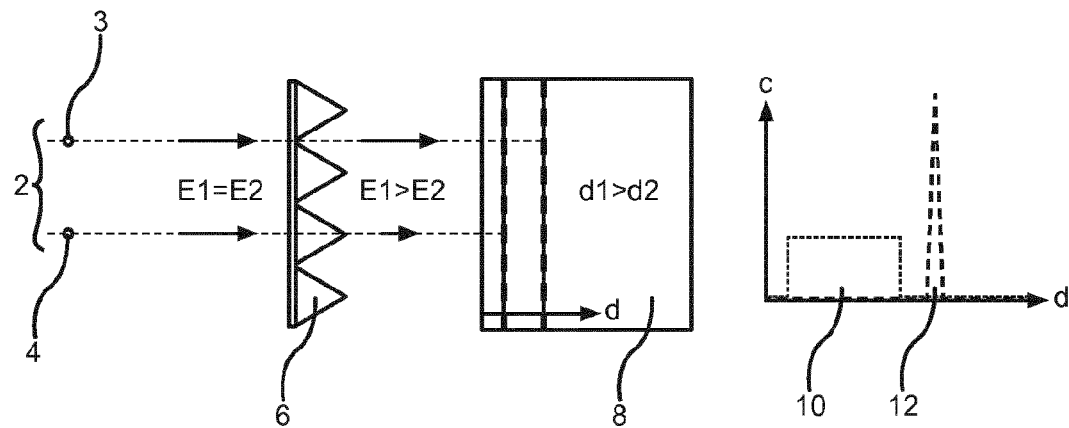
FIG. 1 shows the basic principle of an energy filter 6 used for ion implantation.
Figures 2A, 2B:
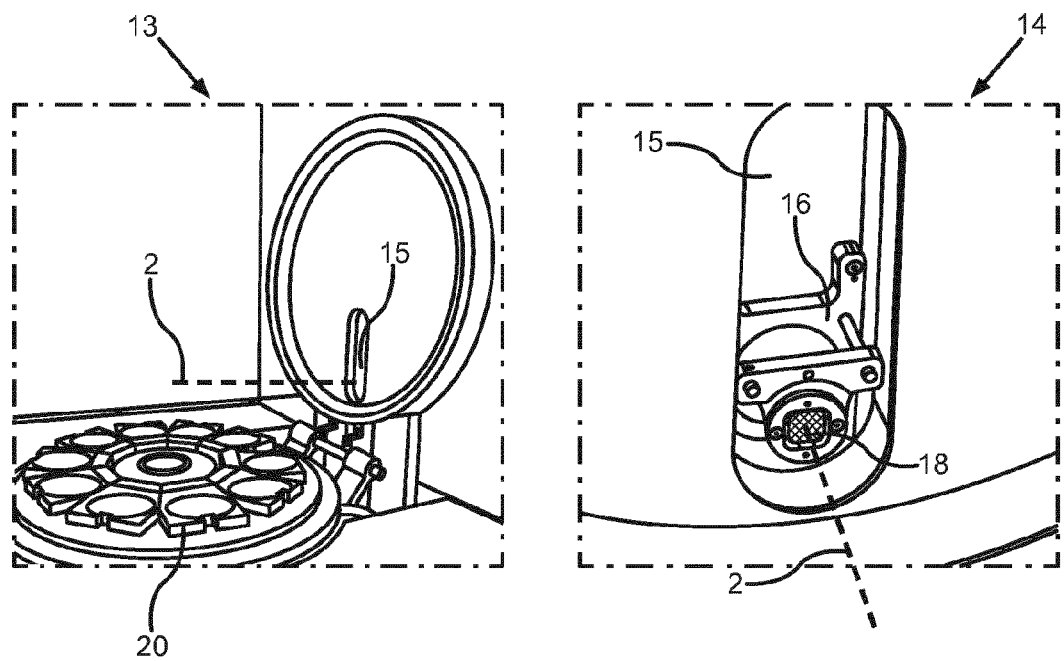
FIG. 2a shows a diagram of an implantation chamber 13 according to the prior art.
FIG. 2b shows a diagram of a beam-line insert 14 with filter membrane 18 according to the prior art.
Figure 5:
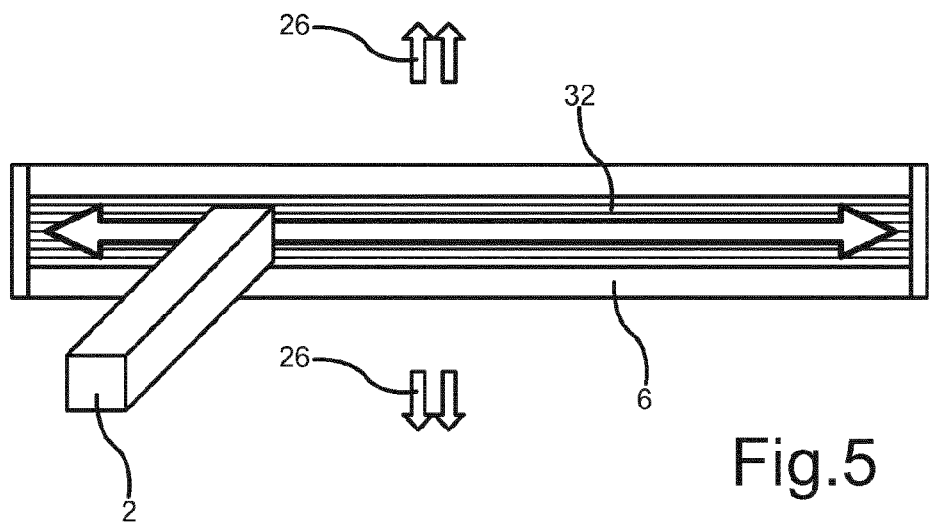
FIG. 5 is a diagram of an adapted deflection of the ion beam for irradiating the active surface of the energy filter.

A first embodiment of the invention will be described in greater detail in the following. To achieve a homogeneous irradiation of a wafer 8 (substrate), the ion beam 2 passing through the implantation filter 6 should scan the entire surface of the wafer (substrate surface) during the implantation. For this purpose, an electrostatic deflection (scanning) of the ion beam 2 is provided in combination with a mechanical movement of the filter 6. A possible structure is shown in FIGS. 4 and 5. Reference number 2 designates the ion beam, reference number 6 the filter, reference number the substrate/wafer, reference number 26 the synchronized oscillation between the filter and ion beam in the y direction, and reference number the oscillation of the ion beam in the z direction.

The scanning occurs electrostatically in the y and z directions, but each direction is scanned in a different way. Scanning occurs rapidly in the z direction, so that the slit-like energy filter 6 is irradiated over its entire active surface. The scanning in the y direction takes the form of a slow, electrostatic oscillating movement, which is executed in synchrony with a coupled mechanical oscillating movement of the filter 6. Thus the ion beam 2 and the active surface of the energy filter 6 are always congruent, so that the ion beam 2 always passes through the filter 6 before it strikes the wafer 8. In the z direction, a dimension of the filter 6 can be the same as the maximum dimension of the wafer 8 in the z direction, so that there is no need to move the filter 6 mechanically in the z direction—only the ion beam 2 is moved in this z direction. In the y direction, the dimension of the filter 6 is smaller than the maximum dimension of the wafer 8, so that, in this direction, the filter 6 is moved synchronously with the ion beam 2 to irradiate in succession all areas of the wafer 8 with the ion beam 2 being conducted through the filter 6 during the implantation.

Another modification of the above embodiment is described in the following.

To optimize the throughput of the energy filter 6, it can be desirable to minimize the irradiated area next to the wafer 8 (overscan), i.e., to irradiate, to the extent possible, only the round wafer 8 but not the areas surrounding the wafer 8. In the simplest case of irradiation according to FIGS. 4, 5, and 6 (right), the oscillating movement of the ion beam 2 is always the same; that is, the ion beam 2 always moves in the z direction between the same two end points (z0 and z1) and always in the y direction between the same two end points (y0 and y1). The filter 6 moves in the y direction synchronously with the ion beam 2 between the associated end points. This leads to a rectangular irradiation surface; i.e., the area scanned by the ion beam 2 is rectangular, and the coordinates of the corner points are defined by the end points of the oscillating movement of the ion beam 2 in the y and z directions. These coordinates are, for example, (z0, y0), (z1, y0), (z0, y1), (z1, y1). In the case of a round wafer 8, therefore, areas are also irradiated with lie inside the rectangular irradiation area but outside the wafer 8. This is shown on the right in FIG. 6, which illustrates the oscillations of the ion beam 2 within a rectangular irradiation area and a round wafer 8.

Figure 6:
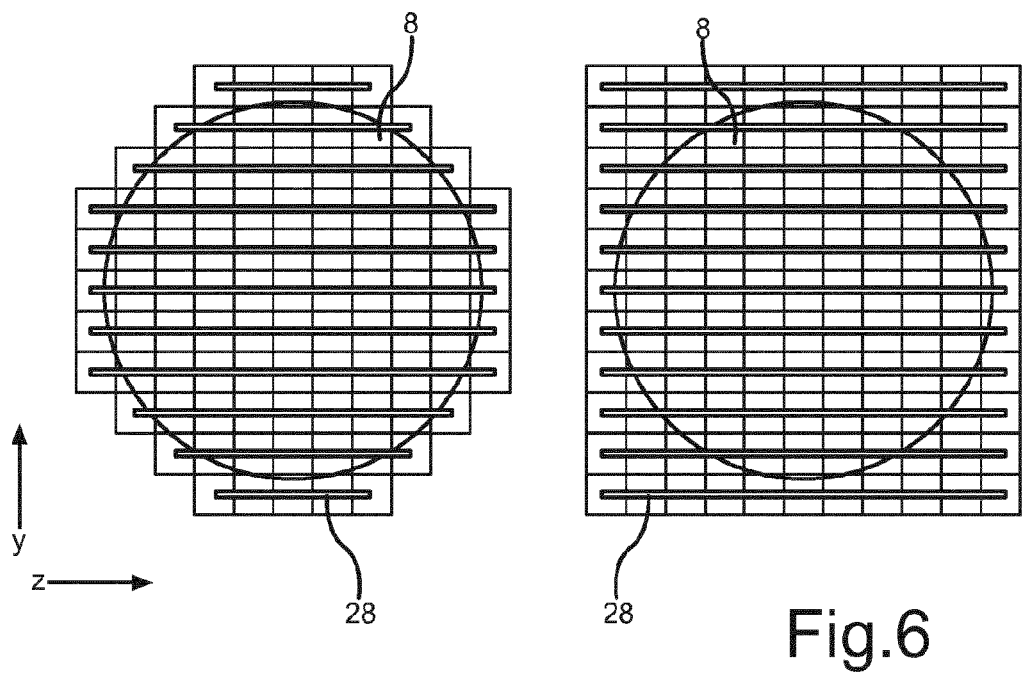
FIG. 6 shows a schematic diagram of the irradiation of a substrate with (i) (FIG. 6, right) a constant beam-oscillation speed in y and z and a constant oscillating movement of the energy filter in y at a constant ion current; and (ii) (FIG. 6, left) a reduced irradiation surface obtained by a variable filter oscillating movement in y and a variable ion beam movement in y and z at a constant ion current.
Figure 7:
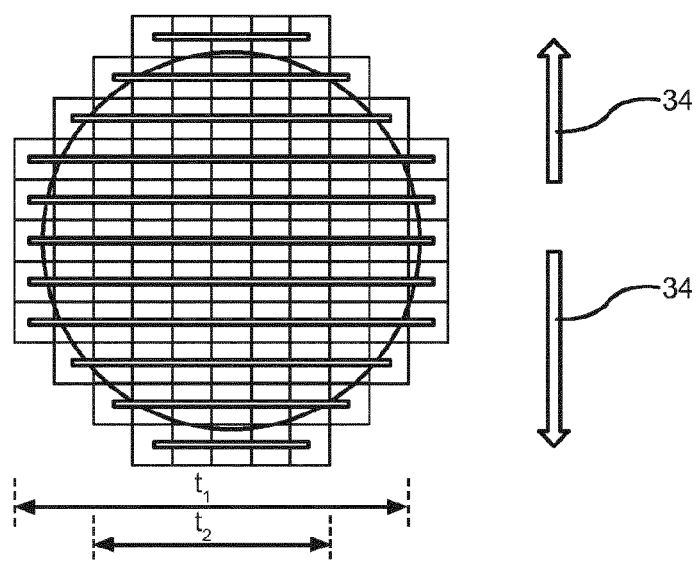
FIG. 7 shows a schematic diagram of the irradiation of a reduced area with variable oscillating movement of the energy filter.

A substrate-optimized deflection of the ion beam 2 in the z direction is shown on the left in FIG. 6 and also in FIG. 7. FIG. 7 shows the irradiation of a reduced area with variable filter oscillation speed and beam velocity. $t_1$ and $t_2$ represent different irradiation times of the beam lines. Reference number 34 designates the variable oscillating movement of the filter unit 6 and of the ion beam 2.

As shown on the left in FIG. 6 and in FIG. 7, the ion beam 2 is deflected only just far enough in the z direction so that the ion beam 2 strikes substantially only the wafer 8. The endpoints of the deflection of the ion beam 2 in the z direction are adapted to the dimensions of the wafer 8. According to one example, the ion beam 2 is moved in the z direction at a substantially constant speed, so that wherever the irradiation occurs, an approximately equal implantation dose is produced. How long it takes for the ion beam 2 to scan the wafer 8 in the z direction once or several times in a defined manner depends on the width of the wafer 8 at the associated y position. This time can be called the "residence time" of the filter 6 at the y position in question, wherein this residence time can change from one y position to another y position when the filter 6 is moved in the y direction in synchrony with the ion beam 2.

According to one example, the filter 6 is moved in the y direction in a stepwise manner. According to another example, the filter 6 is moved in the y direction continuously. In this case, the speed of the slow oscillating movement of the ion beam 2 and of the energy filter 6 in the y direction is adapted in such a way to the time which the ion beam 2 requires to scan the wafer in the z direction once or several times that the congruency of the ion beam 2 and the energy filter 6 is ensured at all times, i.e., that the ion beam 2 always passes through the filter 6 and strikes the wafer.

Additional embodiments of the invention are described in the following.

Figure 8:
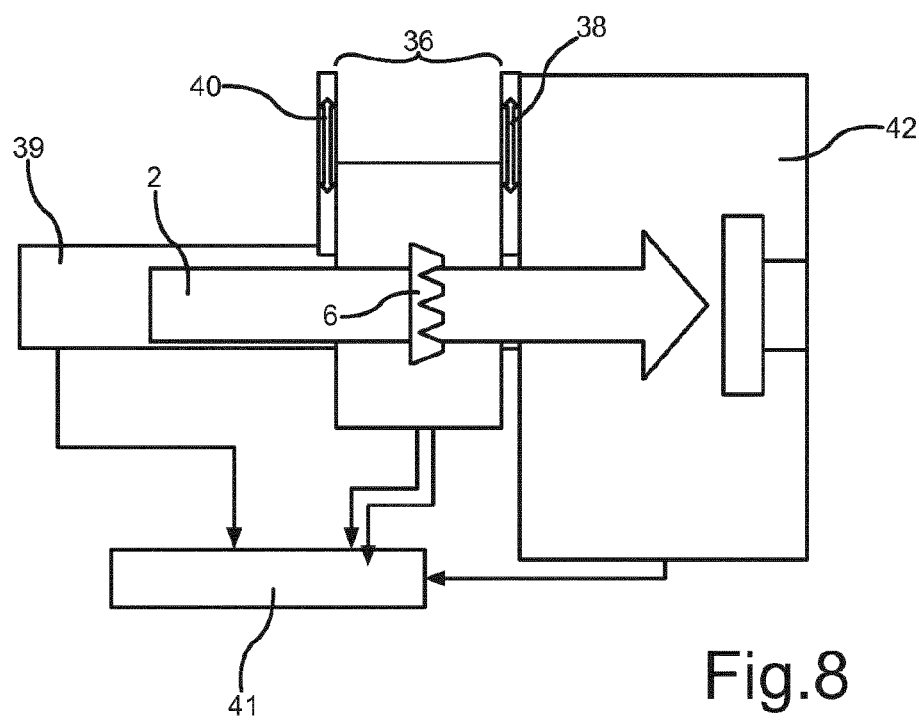
FIG. 8 shows a separate filter chamber, installed in front of the actual wafer chamber.

The essential idea consists in that the devices required for the installation of the energy filter chip in the irradiation system are arranged in a vacuum-sealable unit (which can also be called the filter chamber 36), which is separate from the wafer chamber 42 (which can also be called the wafer end station, the wafer handling chamber, or the implantation chamber), as shown by way of example in FIG. 8.

The filter chamber 36 comprises two openings, which can be closed by seals or valves (first vacuum valve 38 and second vacuum valve 40 in FIG. 8). These seals are open during the irradiation process and are arranged in such a way that, when the seals are open, the ion beam 2 coming from the accelerator can pass unimpeded through the filter 6 and arrive at the substrate 8 to be irradiated. When the openings are closed, the filter 6 in the filter chamber 36 is protected from external mechanical influences. According to one example, the openings can be closed by the seals in a pressure-tight manner, so that, after they have been closed, the same pressure conditions remain preserved which were present in the filter chamber 36 prior to the closing. A vacuum pump 41 can be connected to the filter chamber 36. When the openings are closed, this pump can equalize pressure variations which can result from seals which are not hermetically tight.

When the wafer chamber 42 must be vented so that, for example, the substrate can be replaced, the openings are closed before the venting. The separate filter chamber 36 continues to be pumped down, so that the particle load on the filter 6 is minimized and the pressure conditions remain constant. Mechanical loads on the filter 6 caused by the pumping or venting processes are thus avoided.

The separate energy filter-vacuum chamber 36 is closed during the introduction of the wafer and is open during the implantation. It is separated from the wafer chamber 42 by at least one vacuum valve 38. The wafer chamber 42 is configured as a "commercial" wafer chamber 42 according to the prior art. During the ion implantation process, high vacuum or ultra-high vacuum conditions are present in it. The filter 6 is mounted according to the prior art and/or according to variable holder options. A common vacuum pump system 41 or several independent vacuum pump systems can be provided.

In another embodiment (see FIG. 9), the energy filter 6 is arranged on a movable device (filter holder 44) in the separate upstream vacuum unit (filter chamber 36). Possibly as a result of the design of the separate vacuum unit 36 and of the wafer chuck 4, there may be too much distance between the substrate 8 and the filter 6. This device 44 then serves to bring the energy filter 6 closer to the substrate 8 to be irradiated. The filter 6 can also (but does not have to) be moved through one of the opened seals or vacuum valves (vacuum valve 38 in FIG. 9). Before the filter chamber 36 is closed, e.g., during a wafer replacement, the filter 6 is moved back into the filter chamber 36. The energy filter holder 44 is transferred mechanically into the wafer end station 42 to adjust the distance between the wafer 8 and the filter 6. The double arrow indicates the ability to move the energy filter installation forwards and backwards. Otherwise, the reference numbers designate the same elements with the same properties as those in FIG. 8.

Figure 9:
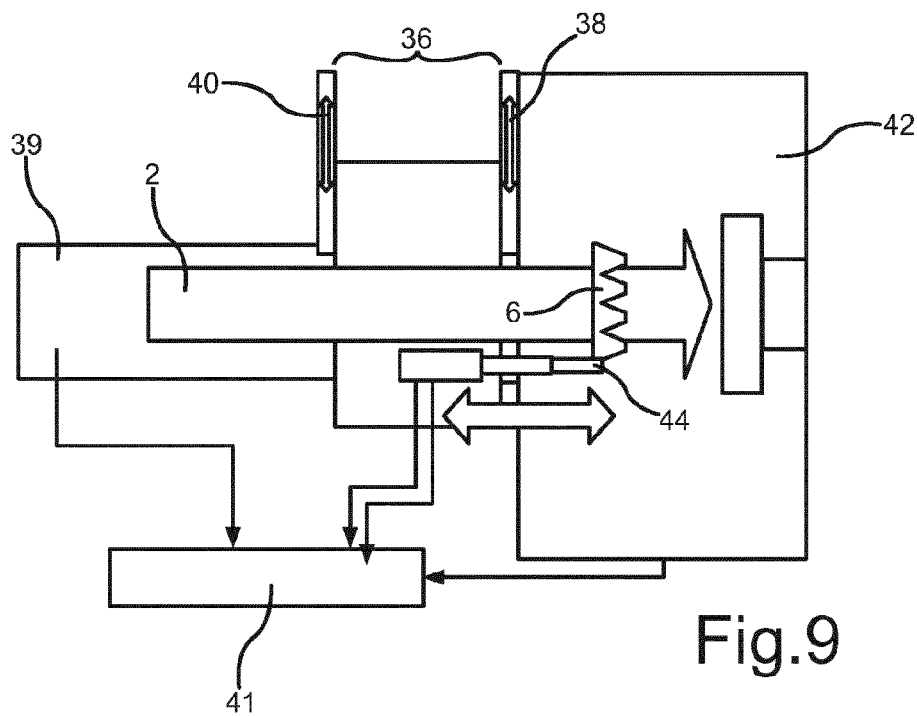
FIG. 9 shows a separate filter chamber, installed in front of the actual wafer chamber, wherein the device for holding the energy filter is arranged in such a way that it can be moved forwards or backwards relative to the wafer chuck, into the vicinity of the wafer chuck.
Figure 10:
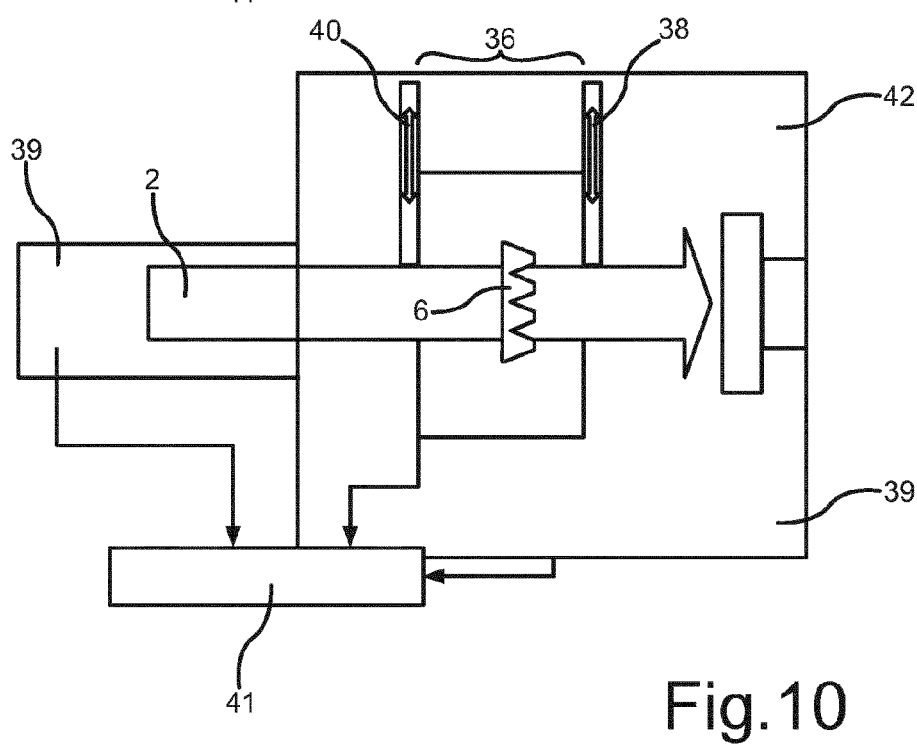
FIG. 10 shows a separate filter chamber, arranged inside the wafer chamber.

In the examples shown in FIGS. 8 and 9, the filter chamber 36 is arranged outside the wafer chamber 42, in front of the beam opening (implantation opening) of the wafer chamber 42. The beam opening is the opening through which the ion beam 2 enters the wafer chamber 42. In another embodiment (see FIG. 10), the above-described separate vacuum unit (filter chamber 36) for accommodating the energy filter chip is arranged inside the wafer chamber 42 (end station). In this case as well, it may be necessary to move the filter 6 mechanically toward the substrate 8. Otherwise, the reference numbers designate the same elements with the same properties as those in FIG. 8.

Additional embodiments of the invention are described in the following with reference to FIGS. 11-14. Referring to the designations of the axes, PDC designates the point defect concentration, IIC the implanted ion concentration, and d the depth. Reference number 46 designates the implanted ion concentration, reference number 48 the left axis, reference number 50 the right axis, reference number 52 the cold implantation defect concentration, reference number 54 the hot implantation defect concentration, reference number 56 the not-end-of-range defects, reference number 58 the end-of-range defects, and the two downward-pointing, parallel arrows in FIGS. 12-14 indicate the reduced defect concentration.

During each ion implantation, collisions of the injected ions with atoms of the substrate material lead to the formation of point defects. In the case of unfiltered implantations, these point defects reach a maximum concentration in the end-of-range area of the injected foreign atoms.

Figure 11:
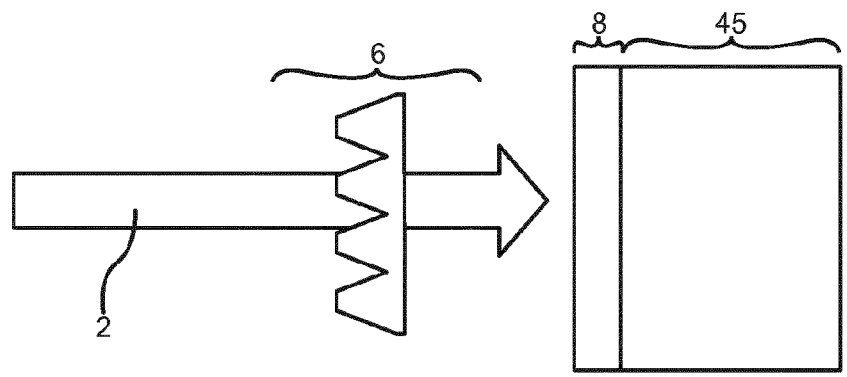
FIG. 11 shows an energy filter arrangement in combination with a heatable wafer mounting device.

It is proposed that the energy filter 6 be used in combination with a heatable wafer chuck 45 (see FIG. 11). The wafer chuck 45 is used to mount the wafer 8 in the wafer chamber 42 and holds the wafer 8 during the implantation. With the novel arrangement, sketched in FIG. 11, of a heatable wafer holder (wafer chuck 45, wafer wheel 20, or any other desired holder) and an energy filter 6 for ion implantation, as-yet-unknown combinations of point defect and foreign atom profiles can be produced. A heatable wafer holder 45 is adapted to wafers 8 of SiC, but also to wafers 8 of any other desired semiconductor materials.

The energy filter 6 can be present in any type of design, for example stationary or movable, in a separate chamber or in the same chamber as the wafer chuck 45, smaller than the wafer 8 or larger than or equal in size to the wafer 8, rotating, provided with a collimation structure, etc.

Profile combinations which can be achieved by irradiating a wafer 8 via the energy filter 6 have the following properties, for example:

The point defect concentration (PDC) is reduced over the entire depth region of the implantation which has been expanded by the energy filter 6.

Figure 12:
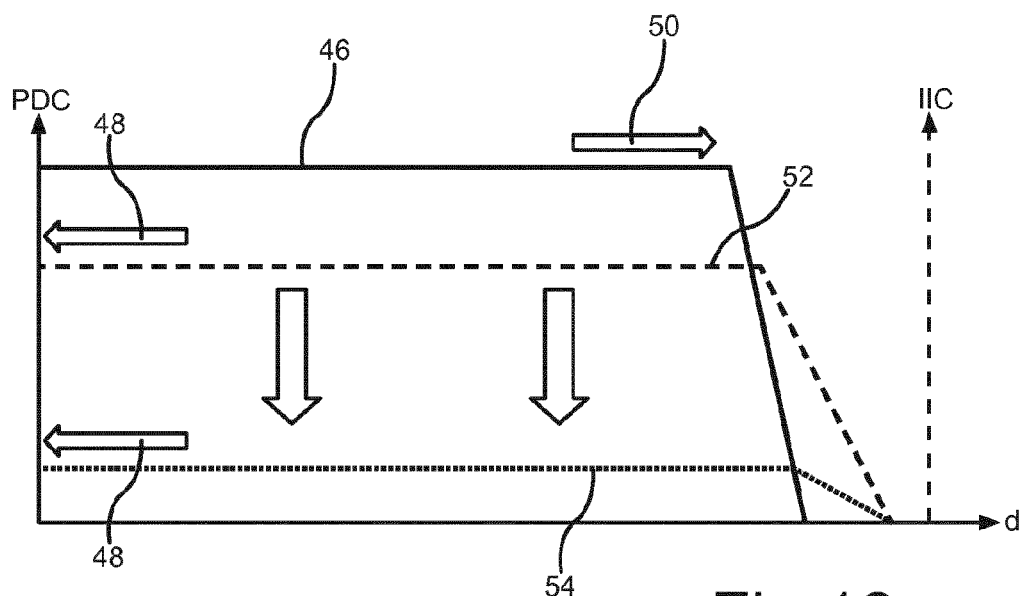
FIG. 12 shows a novel defect and foreign-atom profile (case 1)
Figure 13:
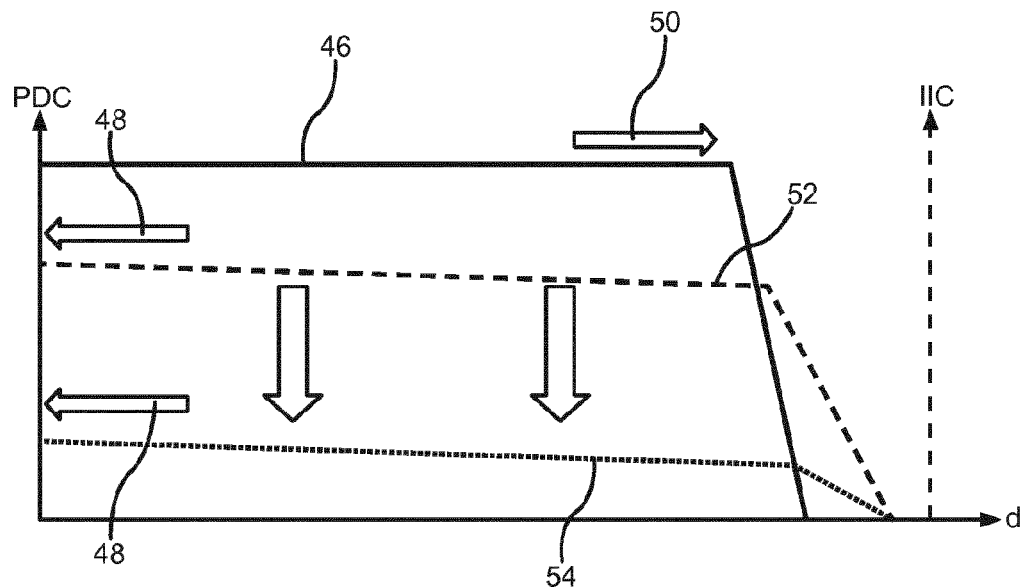
FIG. 13 shows a novel defect and foreign-atom profile (case 2)

The expanded depth range typically extends from the surface to a depth of a few micrometers (see FIGS. 12 and 13).

The concentration depth function of the implanted foreign atoms depends on the geometric and material-technological configuration of the energy filter 6 and thus is completely controllable. The defect depth profiles follow the form of the concentration depth function of the implanted foreign atoms and are determined by them for a given substrate material (see FIGS. 12 and 13).

Figure 14:
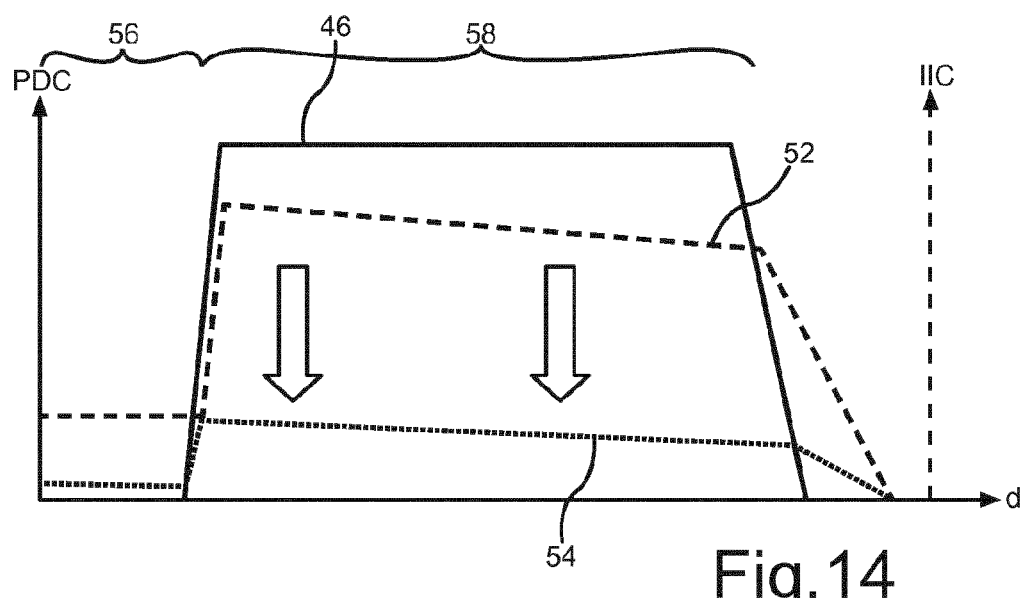
FIG. 14 shows a novel defect and foreign-atom profile, more precisely a dopant profile isolated from the surface.

The defect concentration depth profiles also depend on whether or not ion beam-induced healing effects ("case 1") occur in deeper-lying areas as a result of the ion bombardment. Thus a distinction is made between "case 1" (FIG. 12) and "case 2" (FIGS. 13 and 14). "Case 1" also explicitly comprises the case that the ion beam-induced healing is very efficient, and that therefore (in the case of a box-shaped foreign-atom profile) the defect concentration increases with depth.

The foreign atom profiles and the point defect profiles are smooth; i.e., they are not characterized by peak-like concentration maxima and minima in the depthwise direction. The defect profile therefore has no "waviness".

The expanded depth region can also begin a certain distance below the surface; for example, it can begin at a depth of 2 μm and extend to a depth of 6 μm (see FIG. 14). In this case, a distinction must be made between end-of-range defects 58 and not-end-of-range defects 56. It is true for both types of defects that the concentration is reduced by the increased temperature during implantation.

In another embodiment, the depth range is <1 μm.

The implanted ion is, for example, aluminum in high concentrations.

An increased degree of activation and reproducible activation in comparison to low-temperature energy filter implantations are obtained.

The temperature of the wafer chuck 45 can be adjusted upward from room temperature and is preferably in the range between T=400° C. and T=1,000° C.

The claiming of the novel defect profiles (at increased implantation temperature) also extends to all implantation profiles obtainable by the use of energy filters and their associated defect profiles and to all cases of defect accumulation or ion beam-induced healing, i.e., especially for the two cases "case 1" and "case 2".

The wafer 8 is preferably a semiconductor wafer. Other types of wafers can also be processed, including wafers of optical materials such as $LiNbO_3$.

In the embodiments described above, the implantation filter 6 has in most cases been called an energy filter by way of example, but it is also possible to use other implantation filters known from the prior art within the scope of the invention.

The wafer holder has been called a wafer chuck 45 and a wafer wheel 20 by way of example within the scope of the description, but any other conventional type of wafer holder can also be used.

LIST OF REFERENCE NUMBERS

2 ion beam
3 first ion
4 second ion
6 implantation filter
8 wafer
10 rectangle (with filter)
12 Gaussian distribution (without filter)
13 implantation chamber
14 beam line insert
15 beam opening
16 suspension
18 filter membrane
20 wafer wheel
22 waviness of the defect profile
24 decrease attributable to summation effects
26 synchronized oscillating movement between energy filter and ion beam in the y direction
28 oscillating movement of the ion beam in the z direction
32 active surface of the energy filter
34 variable oscillating movement of the filter unit and ion beam
36 filter chamber
38 first vacuum valve
39 vacuum state
40 second vacuum valve
41 vacuum pump system
42 wafer chamber
44 filter holder
45 wafer chuck
46 implanted ion concentration
48 left axis
50 right axis
52 cold implantation defect concentration
54 hot implantation defect concentration
56 not-end-of-range defects
58 end-of-range defects

The invention claimed is:

1. A device comprising:
    a wafer chamber, which comprises a wafer holder, which is configured to hold at least one wafer, and
    a filter chamber, which comprises a filter holder and first and second closable openings.

2. The device according to claim 1, wherein the first and second closable openings are each sealable in a pressure-tight manner.

3. The device according to claim 1, wherein the first and second closable openings and the filter holder lie on a straight line.

4. The device according to claim 1, wherein the filter holder is movable in at least one direction.

5. The device according to claim 4, wherein the filter holder is movable out of the filter chamber beyond one of the first and second closable openings.

6. The device according to claim 1, wherein the filter chamber is arranged in the wafer chamber.

7. The device according to claim 6, wherein the wafer chamber comprises an implantation opening, wherein the filter holder, the implantation opening, and the wafer holder lie on a straight line in such a way that an ion beam passing through an implantation filter inserted in the filter holder and through the implantation opening can strike a wafer held by the wafer holder.

8. The device according to claim 1, wherein the filter chamber is arranged outside the wafer chamber.

9. The device according to claim 8, wherein the wafer chamber comprises an implantation opening, wherein the filter holder, the implantation opening, and the wafer holder lie on a straight line in such a way that an ion beam passing through an implantation filter inserted in the filter holder and through the implantation opening can strike a wafer held by the wafer holder.

* * * * *